(12) United States Patent
Puma

(10) Patent No.: US 7,289,005 B2
(45) Date of Patent: Oct. 30, 2007

(54) POLAR MODULATOR AND A METHOD FOR MODULATION OF A SIGNAL

(75) Inventor: Giuseppe Li Puma, Bochum (DE)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 11/303,175

(22) Filed: Dec. 16, 2005

(65) Prior Publication Data

US 2006/0171484 A1    Aug. 3, 2006

(30) Foreign Application Priority Data

Dec. 16, 2004  (DE) .................... 10 2004 060 698

(51) Int. Cl.
*H03C 3/38* (2006.01)

(52) U.S. Cl. ............... 332/145; 332/144; 332/108; 332/109; 332/115; 332/149; 375/268; 375/238; 375/294; 375/297; 375/300; 455/108; 455/205; 455/208; 455/260; 455/264; 455/286; 455/114.1

(58) Field of Classification Search ......... 332/108, 332/109, 115, 149, 144, 145; 375/268, 238, 375/294, 297, 300; 455/108, 114.1, 205, 455/208, 260, 264, 286
See application file for complete search history.

(56) References Cited

U.S. PATENT DOCUMENTS

| 6,924,711 B2 * | 8/2005 | Liu .................... 332/159 |
| 2006/0135089 A1 * | 6/2006 | Puma .................... 455/91 |
| 2006/0160499 A1 * | 7/2006 | Puma .................... 455/116 |

FOREIGN PATENT DOCUMENTS

| DE | 195 35 075 A1 | 4/1996 |
| DE | 100 45 761 A1 | 3/2002 |

OTHER PUBLICATIONS

"Pulstechnik", E. Hölzler and H. Holzwarth, vol. 1, Grundlagen, Zweite, 1981, Berlin, 10 pgs.
"Techniques for High Data Rate Modulation and Low Power Operation of Fractional-N Frequency Synthesizers", Michael Henderson Perrott, Thesis Doctor of Philosophy in Electrical Engineering and Computer Science, Sep. 1997, Massachusetts Institute of Technology, 27 pgs.

* cited by examiner

*Primary Examiner*—Arnold Kinkead
(74) *Attorney, Agent, or Firm*—Eschweller & Associates, LLC

(57) ABSTRACT

A polar modulator contains a phase locked loop which is designed to emit a radio-frequency signal at one frequency to one output, with the frequency being derived from the reference signal and from a phase modulation signal at a control input of the phase locked loop. The modulator additionally has a second signal input for supplying an amplitude modulation signal. The second signal input is connected to a control input of a pulse width modulator, one of whose signal inputs is coupled to the output of the phase locked loop. The pulse width modulator is designed to vary the duty ratio of a signal which is applied to the signal input, with this variation being adjustable via a regulation signal at the control input. A filter can be connected downstream from the output of the pulse width modulator and suppresses higher harmonic components in a signal which can be tapped off at the output of the pulse width modulator. The amplitude of an output signal is thus modulated by carrying out pulse width modulation and by subsequent suppression of higher-level frequency components.

20 Claims, 5 Drawing Sheets

$T_{delay} = \tau_0 + a_0\tau_0 + a_1\tau_0 + ... a_N\tau_0$

— H1
— H2
— H3

POLAR MODULATOR AND A METHOD FOR MODULATION OF A SIGNAL

REFERENCE TO RELATED APPLICATIONS

This application claims the benefit of the priority date of German application DE 10 2004 060 698.6, filed on Dec. 16, 2004, the contents of which are herein incorporated by reference in their entirety.

FIELD OF THE INVENTION

The invention relates to a polar modulator, and to a method for modulation of a signal.

BACKGROUND OF THE INVENTION

In modern communication systems, the information to be transmitted is coded both in the phase and in the amplitude of a signal. This means that it is possible to achieve considerably higher data transmission rates than those with pure amplitude and/or phase modulation. Examples of modulation types such as these are PSK modulation (Phase Shift Keying). These include, inter alia π/4-DQPSK, 8-DPSK or 8-PSK modulation. Quadrature amplitude modulation methods (QAM) also code the information to be transmitted both in the amplitude and in the phase. In contrast to analog amplitude or frequency modulation, the stated modulation methods are referred to as digital modulation types.

FIG. 9 shows a so-called constellation diagram for QPSK modulation. The abscissa in this case represents a first component, which is referred to as the real component I. The ordinate forms the second component, the quadrature component Q. The information to be transmitted is coded, as a function of its content, at one of the illustrated points by a value pair i, q. A value pair i, q such as this is referred to as a symbol. In the illustrated exemplary embodiment, one such symbol with the QPSK modulation type that is used codes a total of two bits of data content, specifically the bits 00, 01, 10 or 11. The amplitudes of the i and q values change over time, depending on the information to be transmitted. The amplitude of the overall signal is thus also changed. QPSK modulation is therefore referred to as a modulation type with a non-constant envelope (non-constant envelope modulation). The QPSK modulation type is used, for example, for the WCDMA/UMTS mobile radio standard. The EDGE mobile radio standard uses 8-PSK modulation, and thus codes 3 bits per symbol.

In addition to the representation of a symbol by a value pair i, q, it is possible to specify the phase φ and the amplitude r of the same symbol. The symbol which represents the data content 00 is illustrated in a corresponding form in the exemplary embodiment shown in FIG. 9. The two representations using IQ notation and rφ notation are equivalent.

In addition to I/Q modulators, polar modulators can also be used for transmission of modulated signals. While I/Q modulators process the i, q value pairs for modulation of a signal, polar modulators modulate the phase φ onto a carrier signal, and change the amplitude r. FIG. 7 shows one embodiment of a known I/Q modulator, in which the components I, Q are each supplied as digital signals to a digital/analog converter 901, which converts them to analog components and supplies them via a low-pass filter 902 to the inputs of two mixers 903. Signals with a phase shift of 90° between them are supplied to the two mixers as a local oscillator signal. After frequency conversion in the two mixers, the two signals are added, and are amplified in a power amplifier PA.

FIG. 8 shows one example of a known polar modulator. The information to be transmitted is in the form of digital data and is preprocessed in a coder circuit 95 to form the amplitude information r and the phase information φ. This information is in the form of symbol values $a_k$, where $a_k$ includes not only the amplitude information r but also the phase information φ. The symbol values $a_k$ are supplied to a pulse former circuit 93, where they are preprocessed. The preprocessed data then has its phase value φ(k) and its amplitude value r(k) converted in the circuit 94. The phase information φ(k) is supplied to a phase locked loop PLL, and is used for the purpose of modulating the output signal from the phase locked loop appropriately for the information coded in the phase. A phase-modulated output signal φ(t) is thus produced at the output of the control loop PLL. At the same time, the amplitude information r(k) is applied to a digital/analog converter DAC, which converts the digital amplitude information r(k) to an analog signal r(t) which is a function of time. The analog amplitude modulation signal r(t) is supplied to a mixer via a low-pass filter. The phase-modulated signal is joined to the amplitude modulation signal in this mixer. The mixer uses the amplitude modulation signal r(t) to carry out amplitude modulation of the already phase-modulated signal.

The problem with this solution is the requirements for the last mixer stage. This should have a sufficiently highly linear transfer function in order to produce adequate signal quality within the wide amplitude range that is required in many mobile radio standards. Amplitude and phase distortion, which is dependent on the amplitude modulation signal r(t), can occur if the mixer transfer function is not linear. Distortion of this type is referred to as AM/AM or AM/PM distortion.

The distortion results in data errors, and changes the frequency spectrum of the emitted signal.

If the requirements are taken into account, the embodiment as illustrated in FIG. 8 requires a large amount of space for the mixer. Furthermore, a polar modulator such as this cannot be designed using new types of CMOS technologies with low supply voltages in the range from 1.5 V to 2.5 V.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

Aspects of the present invention can provide a polar modulator which is suitable for low supply voltages and can be designed in a space-saving manner, for example in the form of an integrated circuit in a semiconductor body. Additionally, aspects of the invention can specify a method for modulation of a signal, which can be carried out with a low power consumption.

In accordance with one aspect of the invention, a polar modulator is disclosed. The polar modulator has a first signal input, a second signal input, a phase locked loop, a pulse width modulator, and a filter.

The first signal input supplies a phase modulation signal and the second signal input supplies an amplitude modulation signal.

The phase locked loop has a reference input for supplying a reference signal and a control input, which is coupled to the first signal input. The phase locked loop being designed to emit a radio-frequency signal at one frequency to an output with the frequency being derived from the reference signal and from the phase modulation signal at the control input of the phase locked loop.

The pulse width modulator has a signal input and a control input. The pulse width modulator is designed to vary the duty ratio of a signal which is applied to the signal input, with this variation being adjustable via a regulation signal at the control input, and with the signal input being coupled to the output of the phase locked loop and the control input being coupled to the second signal input.

The filter, which is arranged downstream from an output of the pulse width modulator, for suppression of harmonic components of a signal which can be tapped off at the output of the pulse width modulator.

This arrangement results in amplitude modulation on the basis of an amplitude modulation signal that is supplied, in that the signal which has been phase-modulated by the phase locked loop is supplied to a pulse width modulator, which produces a pulse-width-modulated signal which varies over time and is processed further in a filter in order to suppress harmonic components.

In this case, the invention makes use of the fact that square-wave signals with a specific duty ratio can be represented by a Fourier series development of sinusoidal signals. The amplitude of the fundamental frequency of the series development in this case depends on the duty ratio of the square-wave signal. It is thus possible by appropriate choice of the duty ratio with the aid of a pulse width modulator to produce, inter alia, the fundamental frequency in the Fourier series with the desired amplitude. Only the fundamental frequency is then still emitted at the output of a filter which is connected downstream from the pulse width modulator. Higher frequency components which occur in the series development are suitably suppressed by the downstream filter.

The described solution can, in one example, be implemented using digital circuits. In particular, the phase locked loop 2 in one development is in the form of a digital phase locked loop. The amplitude and/or phase modulation signal is also in the form of a digital signal in one embodiment.

In a further aspect of the invention, an amplifier circuit is provided between the output of the phase locked loop and the signal input of the pulse width modulator, and has a limiting gain response.

One aspect relates to the design of the pulse width modulator, which may have a flipflop whose clock input forms the signal output of the pulse width modulator. A data output of the flipflop is connected to the output of the pulse width modulator. A reset input of the flipflop can be supplied with a pulsed signal which is derived from the regulation signal applied to the control input. In this refinement, the pulse width of a signal which is applied to the clock input of the flipflop is modulated on the basis of the pulsed signals. In this context, it may be expedient to supply a signal at the same level to a data input of the flipflop.

One alternative refinement of the pulse width modulator has a logic gate whose first input forms the signal input of the pulse width modulator. The data output of the logic gate is connected to the output of the pulse width modulator. A second input of the logic gate can be supplied with a pulsed signal which is derived from the signal applied to the control input. The logic gate may be in the form of a logic AND gate. In this case as well, the phase-modulated signal which is applied to the first input and is emitted from the phase locked loop has its pulse width varied.

In one aspect of the invention, the pulse width modulator has a delay unit which is designed to emit a pulsed signal to an output in a manner which can be controlled over time. The output is in this case connected to the logic gate or to the flipflop.

In a further aspect of the invention, the phase locked loop contains a frequency divider with a variable division ratio in a feedback path. An adjustment input of this frequency divider can be supplied with an adjustment signal which is derived from the phase modulation signal.

A sigma-delta modulator can be connected upstream of the adjustment input of the frequency divider and is designed to produce and emit a control signal which represents a rational division ratio. The division ratio is produced from the phase modulation signal at the first signal input of the polar modulator according to the invention.

In one aspect of the invention, it is likewise possible to provide for a sigma-delta modulator to be connected upstream of the control input of the pulse width modulator. Its output values can be synchronized with the aid of a synchronization unit to the carrier signal, and possibly also to the signal which is emitted from the phase locked loop. In one possible embodiment of the invention, the frequency of the carrier signal is divided down for this purpose, for example by a factor of 2, and is supplied to a clock input of a flipflop circuit.

The sigma-delta modulator can use the amplitude modulation signal to produce an oversampled regulation signal for adjustment of the duty ratio in the pulse width modulator. This makes it possible to reduce the quantization noise, and to prevent spurious data transmission.

In a further aspect of the invention, a predistortion unit is connected between the regulation input of the pulse width modulator and the second signal input, in order to supply an amplitude modulation signal. In one preferred embodiment, this predistortion unit has a table in which values are stored which represent a reciprocal function of a trigonometric function, such as a sine or a cosine function. The predistortion unit prevents non-linearity resulting from the signal processing in the pulse width modulator. In this context, it is likewise expedient to provide a phase compensation unit, which is arranged between the first signal input of the polar modulator and the control input of the phase locked loop and has an open-loop and closed-loop control input which is coupled to the regulation input of the pulse width modulator. This compensates for any amplitude/phase distortion resulting from the processing of the phase-modulated signal in the pulse width modulator.

In accordance with another aspect of the invention, a method is provided. A phase locked loop is provided with a variable frequency division ratio in a feedback path in the phase locked loop. Phase information and amplitude information are provided for signal modulation. The phase information is supplied to the phase locked loop. The frequency division ratio is adjusted as a function of the phase information. A phase-modulated pulsed signal is generated as a function of the selected frequency division ratio. The pulse width of the phase-modulated pulsed signal is varied as a function of the amplitude information. The phase-modulated signal is filtered in order to suppress higher-order harmonic signal components in the changed signal.

In consequence, no mixing process is carried out for amplitude modulation, and the phase-modulated signal is instead pulse-width-modulated and is then filtered in order to suppress undesirable frequency components.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail, using examples, in the following text, with the assistance of the drawings, in which.

DETAILED DESCRIPTION OF THE INVENTION

Figure 1:
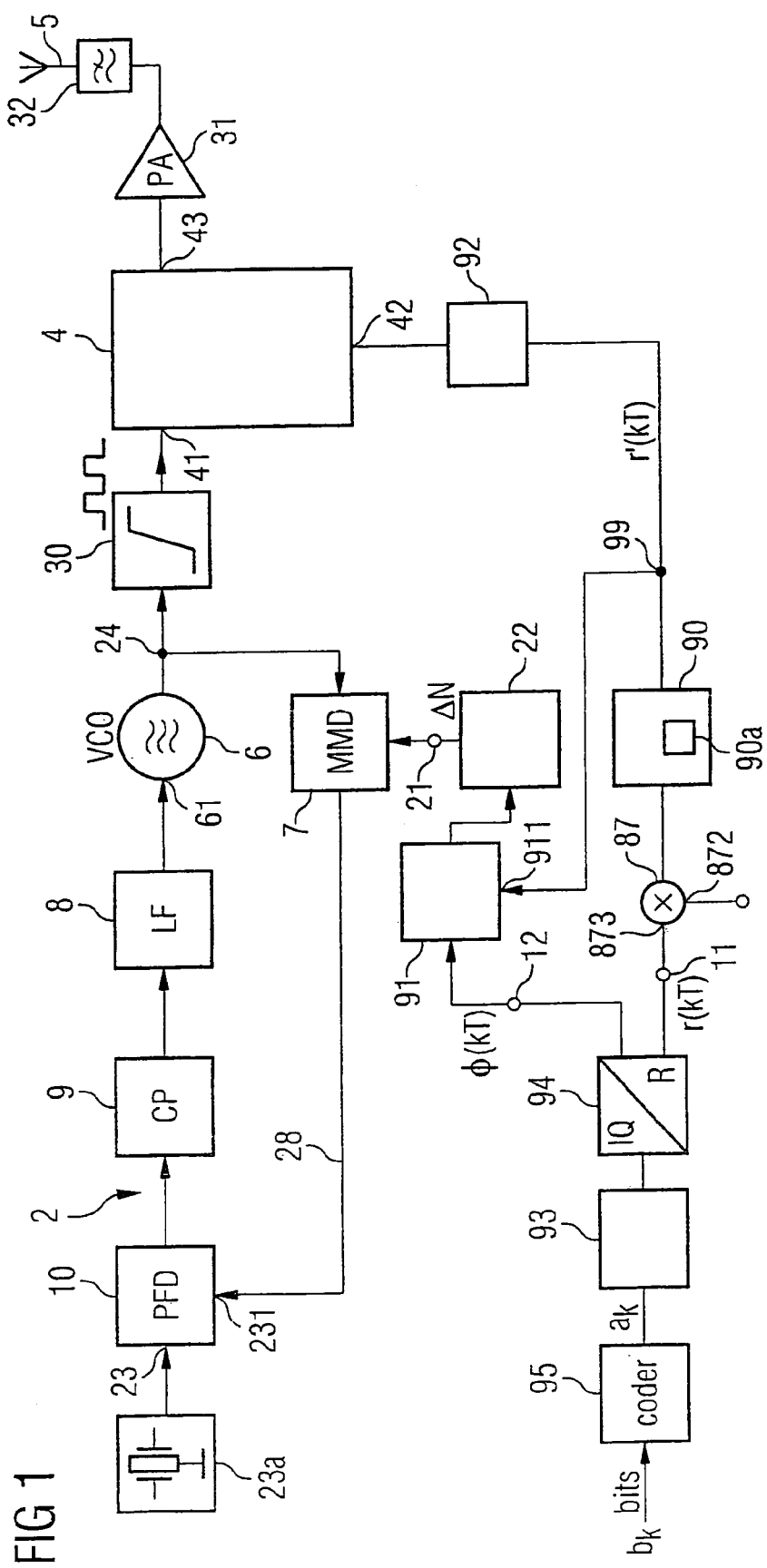
FIG. 1 shows one embodiment of the polar modulator in accordance with an aspect of the invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

FIG. 1 shows a polar modulator according to the invention, which can be integrated in as an integrated circuit in a semiconductor body. Contact points are applied to the surface of the semiconductor body and supply signals to the integrated circuit. The technology used in this case differs, depending on the requirements. For example, the polar modulator according to the invention may be designed using CMOS technology. Silicon, gallium arsenide or silicon germanium (Si Ge) may be used as the semiconductor material, although other semiconductor materials are, of course, also feasible.

The invention proposes that the amplitude of the signal to be transmitted be changed in a polar modulator by means of the duty ratio or the pulse width of a digital signal. This means that there is no need for power-consuming and space-consuming switching elements, such as mixers and digital/analog converters.

The duty ratio η is defined as the ratio of the pulse width $T_H$ to the pulse period $T_P$. This ratio is shown in the graph in FIG. 5, in which the pulse illustrated has a duty ratio of 50%. The pulse length $T_H$ is therefore precisely half the magnitude of the overall period. Thus, in general:

$$\eta = \frac{T_H}{T_P}$$

Figure 5:
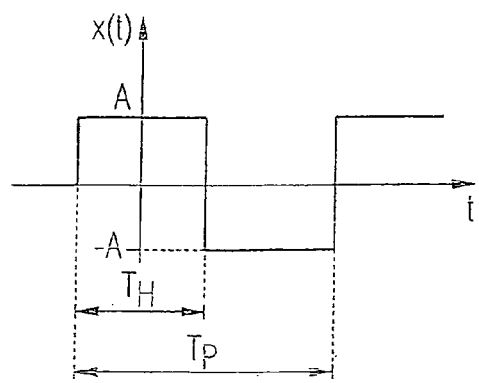
FIG. 5 shows a time/amplitude graph in order to illustrate a square-wave signal.

In the example shown in FIG. 5, the duty ratio is η=0.5. Square-wave signals of the type illustrated in FIG. 5 can be represented by means of a Fourier series development. Thus, for a square-wave signal:

$$x(t) = A(2\eta - 1) + 4A \sum_{n=1}^{\infty} \frac{\sin(n \pi \eta)}{n \pi} \cos(n \varpi t)$$

where η indicates the duty ratio, that is to say $T_H$ divided by $T_P$. If the duty ratio is η=0.5, as illustrated in FIG. 5, the first term becomes A(2η−1).

Figure 6:
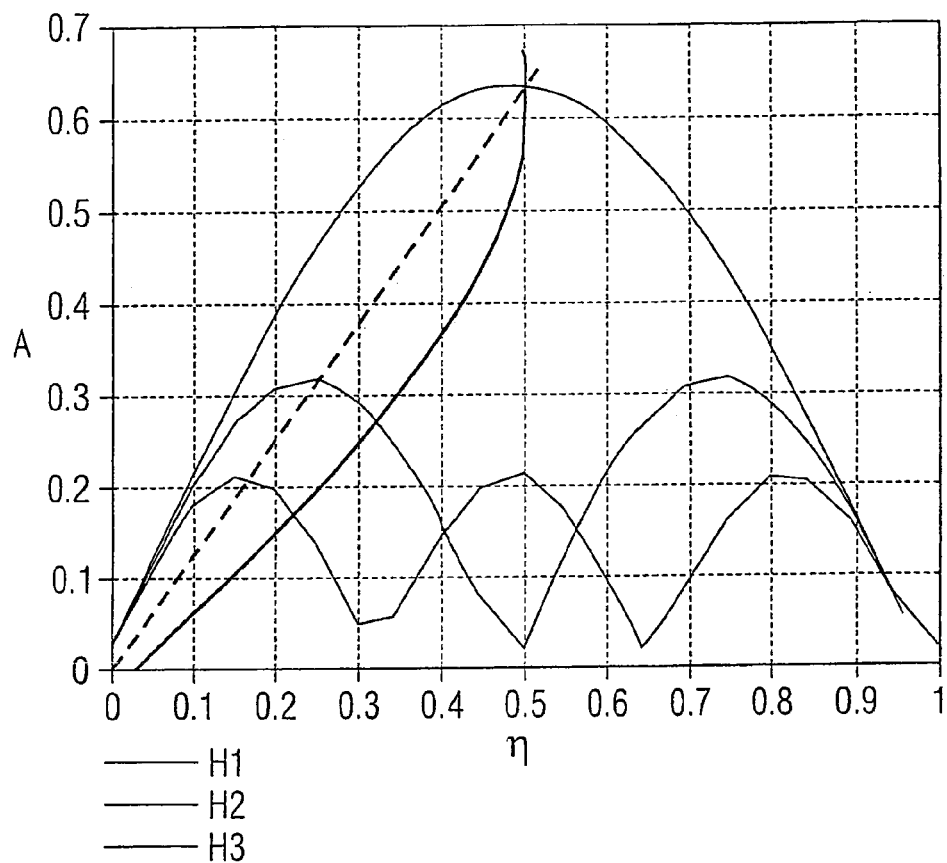
FIG. 6 shows a graph in order to illustrate the relationship between the amplitude and the duty ratio.
Figure 7:
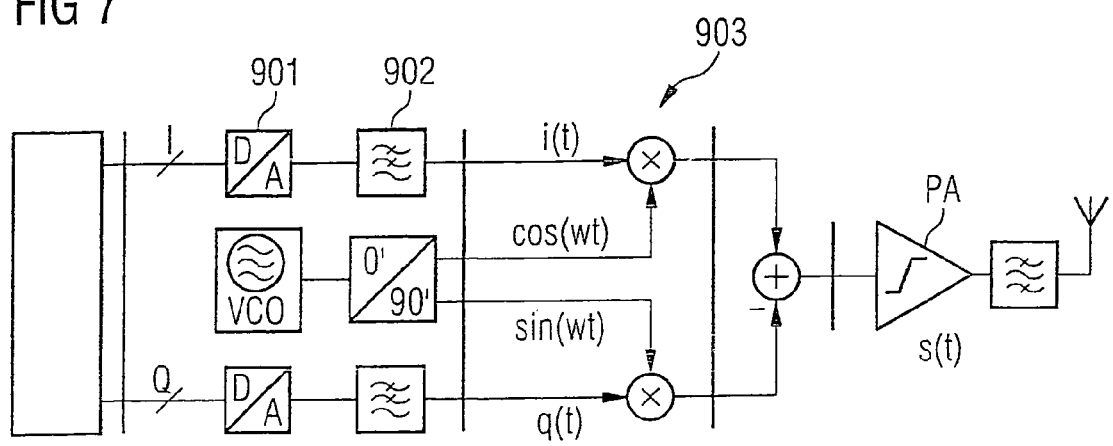
FIG. 7 shows a known I/Q modulator.
Figure 8:
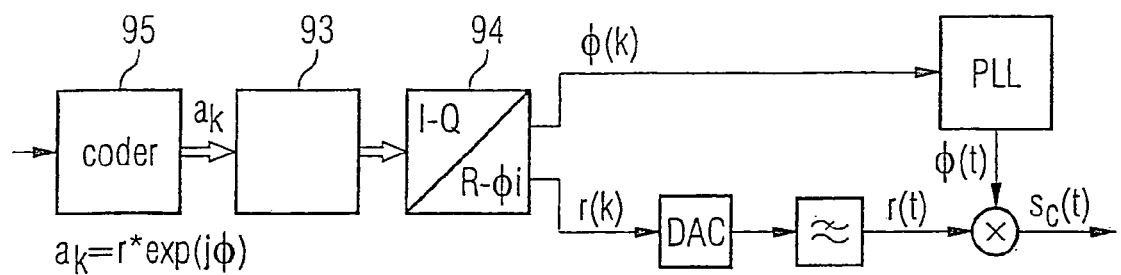
FIG. 8 shows a known polar modulator.
Figure 9:
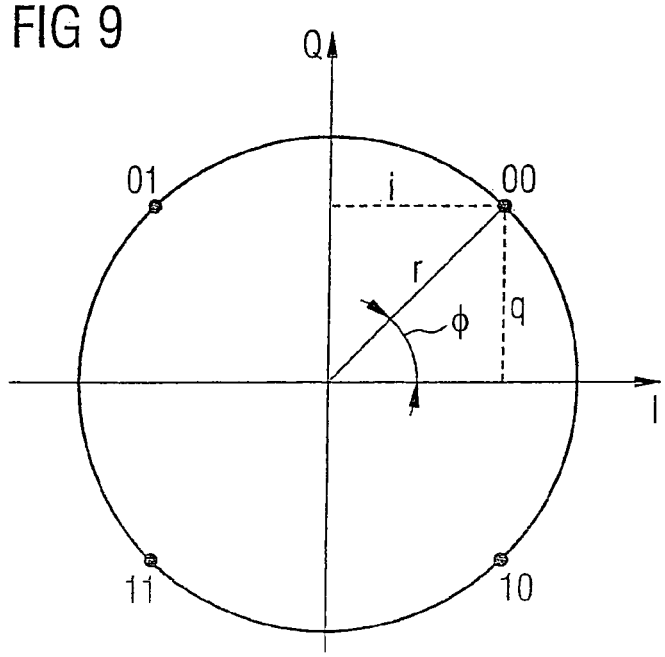
FIG. 9 shows a constellation diagram in order to illustrate a symbol using I/Q and polar notation.

FIG. 6 shows the relationship between the amplitude and the duty ratio for the first three harmonic components H1, H2, H3 in the series development. As can be seen, when the duty ratio is η=0.5, the fundamental frequency H1, that is to say the first harmonic, reaches the maximum amplitude value of about A=0.64. With a duty ratio between η=0 and η=0.5, the amplitude thus rises from low values in the region around A=0 to the maximum value of A=0.64. The amplitude of the fundamental frequency in the Fourier series development can thus be defined by the choice of the duty ratio.

The polar modulator according to the invention uses this response in order to vary the amplitude of the signal in accordance with the requirements for the signals to be transmitted, by means of pulse width modulation of the phase-modulated signal.

For this purpose, the polar modulator as shown in FIG. 1 contains a phase locked loop 2 which has a phase detector 10 with a reference input 23, to which a reference signal is supplied from a reference generator 23a. The phase detector 10 also has a feedback input 231, to which a signal which has been fed back from the phase locked loop is supplied. The signals which are applied to the inputs 23 and 231 have their phases compared in the phase detector 10. The detector 10 uses this comparison to produce a control signal, which is applied via a charge pump 9 and a loop filter 8 to a control input of a voltage controlled oscillator 6. The voltage controlled oscillator 6 changes the frequency of its output signal as a function of this control signal, which essentially represents the phase difference between the signals applied to the inputs 23 and 231. A node 24 is provided at the output of the voltage controlled oscillator 6, and is connected to a feedback path 28.

The feedback path 28 contains a frequency divider 7 with a variable division ratio. The frequency divider 7 divides the frequency of signals which are applied to its input side by a division factor which can be controlled via the adjustment input, and supplies the frequency-divided signal to the feedback input 231 of the phase detector 10.

The control input 21 is connected to a sigma-delta modulator 22, which is itself coupled to a first signal input 12 in order to supply a phase modulation signal φ(kt). The sigma-delta modulator 22 produces a non-integer division factor, with an integer division value N and a fractional division value ΔN, on the phase modulation signal ϕ(kt). This division factor, which is in the form of a digital value, is transferred by it to the frequency divider 7 in order to set the division ratio.

A slightly modified form of the phase locked loop has a 2-point modulator in order to set the frequency more quickly. In this case, the control input 2 of the control loop is connected not only to the control input of the frequency divider 7 but also to a second regulation input for the oscillator 8. In the event of a frequency or phase change, this is supplied to the oscillator both as a new division signal and as an additional regulation signal. The oscillator thus very quickly starts to oscillate at the new frequency, while the control loop has sufficient time to readjust itself again.

On the output side, the phase locked loop is connected to a limiting amplifier 30, which uses the signal emitted from the voltage controlled oscillator 6 to produce a square-wave signal. The phase information is in this case still included in the so-called zero crossing of the square-wave signal. The output from the limiting amplifier 30 is connected to one input 41 of a pulse width modulator 4. The pulse width modulator 4 also has a control input 42, which is coupled to the first signal input 11 in order to supply the amplitude modulation signal r(kt). On the output side, the pulse width modulator 4 is connected to an amplifier 31. The outputs of the amplifier 31 leads to a low-pass filter 32 and to a matching network and an antenna 5.

During operation, a regulation signal for modulation of the pulse width of the signal applied to the input 41 is supplied to the control input 42 of the pulse width modulator 4. The pulse width modulator varies the duty ratio of the signal which is applied to its input side, is in the form of a square wave and has already been phase-modulated, and emits this signal at its output 43. As already explained with reference to FIG. 6, the square-wave signal which is emitted from the pulse width modulator 4 and has a specific duty ratio represents the heterodyning of a large number of harmonic frequencies. The amplifier 31 contains a low-pass filter which filters the higher harmonic frequency components out of the square-wave signal. The frequency components of the second harmonic H2 and of all subsequent harmonics H3 are thus suppressed, and only the fundamental frequency H1 is passed to a downstream amplifier 31 and to the matching network 32. The amplitude of the fundamental frequency H1 is in turn dependent on the duty ratio, which is predetermined by the pulse width modulator. At the same time, the fundamental frequency has the same phase information as the signal applied to the input of the modulator 4. Thus, overall, this results in amplitude modulation of the already phase-modulated signal emitted from the phase locked loop, by pulse width modulation with subsequent filtering.

One additional aspect is the non-linear transfer function of the fundamental frequency H1, which is represented in FIG. 6 by a single sinusoidal half-cycle. The illustrated fundamental frequency H1 is not linear in the duty ratio range from 0 to 0.5. In order therefore to ensure that the polar modulator has a linear transfer function for amplitude modulation with the aid of pulse width modulation, it is expedient to distort the digital amplitude modulation signal in a suitable form in advance. In consequence, pulse width modulation is carried out with a predistorted digital amplitude modulation signal, thus compensating for the described non-linearity in the output signal.

From the signal point of view, such compensation can be achieved by suitable predistortion with the reciprocal function of the function to be distorted. As is shown in the illustration in FIG. 6, predistortion represents the inverse function of the signal to be distorted. Since, in the present exemplary embodiment, the function to be distorted is formed by a sinusoidal function, suitable compensation can be achieved by the inverse sinusoidal function.

The input 11 for supplying the amplitude modulation signal r(kt) is thus followed by a predistortion unit 90 which contains a table 90a in which the values for the inverse sinusoidal function are stored as a function of various duty ratios. An amplitude modulation signal which is applied on the input side is thus multiplied by a value of the inverse signal transfer function. The value of the amplitude modulation signal is therefore changed as a function of its own value. The result is supplied as a digital value to a sigma-delta modulator 92 which uses this, by means of an oversampling process, to produce a regulation signal which it applies to the input 42 of a synchronization unit, which is part of the pulse width modulator 4. The oversampled regulation signal has allowed a reduction in the quantization noise and/or particularly accurate setting of the pulse width modulation in the pulse width modulator 4.

The phase of the signal emitted from the phase locked loop 2 is also changed by the pulse width modulation, that is to say by the change in the duty ratio. It is therefore necessary to change a phase as a function of the amplitude modulation signal r(kt), in order to compensate for this effect. A phase delay element 91 is therefore connected between the first signal input 12 for supplying the phase modulation signal ϕ(kt) and the sigma-delta modulator 22, which uses this to produce the control signal for adjustment of the frequency division ratio. This phase delay element 91 contains a control input 911, which is connected to the node 99. A predistorted amplitude modulation signal is therefore supplied to the phase delay element 91. The phase modulation signal ϕ(kt) is changed by the phase matching unit 91 in such a way that the subsequent pulse width modulation compensates for this phase offset again.

The polar modulator illustrated in FIG. 1 is connected by its first and its second signal inputs to a circuit 94 which uses the data $a_K$ to be transmitted to produce the amplitudes and phase information to be transmitted, and supplies the phase modulation and/or amplitude modulation signal to the inputs 12 and 11.

Figure 2A:
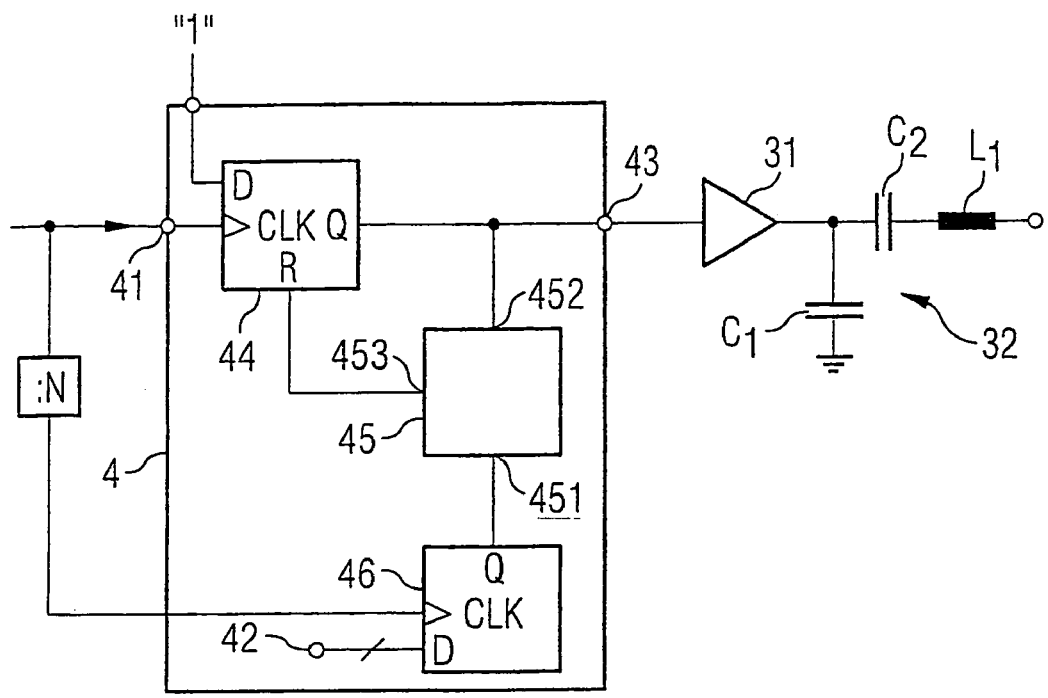
FIG. 2A shows a refinement of the pulse width modulator based on the exemplary embodiment shown in FIG. 1.

FIG. 2A shows a first embodiment of the pulse width modulator 4, as is used in the polar modulator according to the invention. Components which act in the same way and/or have the same function are in this case provided with the same reference symbols. The illustrated exemplary embodiment of the pulse width modulator takes account of the fact that the amplitude modulation signal must be produced as far as possible in synchronism with the corresponding phase-modulated carrier signal at the input 41 of the pulse width modulator 4 in order to avoid producing transmission errors in the useful signal.

The pulse width modulator 4 therefore also contains a synchronization unit comprising a frequency divider, whose input side is connected to the input 41 and which supplies a frequency-divided signal to a clock input of a flipflop circuit 46. The data input D of the flipflop 46 forms the control input 42 of the pulse width modulator 4.

The input 41 of the pulse width modulator 4 is also connected to the clock input CLK of a flipflop circuit 44. The data input of the flipflop 44 leads to a further input of the pulse width modulator 4. This input is always supplied with a signal at a high logic level, a logic 1. The data output Q of the flipflop 44 is connected to the output 43 of the pulse width modulator 4.

The pulse width modulator 4 also contains a delay circuit 45, one output 453 of which is connected to the reset input of the flipflop 44. The delay circuit 45 contains an input 452, which is connected to the data output Q of the flipflop 44. A regulation input 451 for closed-loop control of the delay leads to the data output Q of the flipflop 46, so that the delay is synchronized. In this embodiment, the D flipflop 44 is reset by a signal at the reset input, and in consequence produces a signal at a logic low level at its data output Q. Each rising clock flank at the clock input CLK produces a rising clock flank in the output signal at the data output Q. The rising clock flank is delayed by a certain value by the delay unit 45 in accordance with the requirement from the amplitude modulation signal, and is not supplied to the reset input R of the flipflop 44 until this time. In consequence, the pulse widths of the pulses at the clock input CLK are produced in a changed form. On the output side, the signal is amplified in an amplifier 31 and is emitted via a matching network 32. The matching network 32 is at the same time used as a low-pass filter with a cut-off frequency between the fundamental frequency and the second harmonic frequency. The phase and amplitude predistortion maintain the linearity. Only the fundamental frequency is passed to a downstream antenna, as in FIG. 1.

Figure 2B:
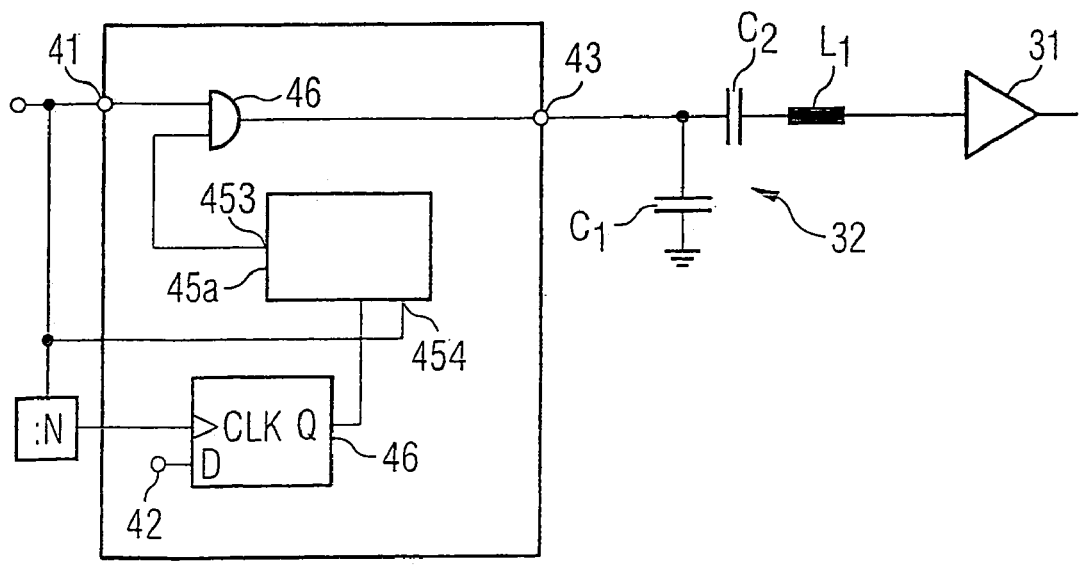
FIG. 2B shows a second embodiment of the pulse width modulator in accordance with an aspect of the invention.

FIG. 2B shows one alternative embodiment of a pulse width modulator. In this case, in addition to the synchronization unit, the pulse width modulator 4 contains a logic AND gate 46 with a first and a second input. The first input forms the signal input 41 for the pulse width modulator 4. The second input of the logic AND gate is connected to the output 453 of a delay circuit 45a. The delay circuit 45a has a regulation input, which is connected to the data output of the flipflop 46. The delay circuit 45a is used to emit a pulsed signal, which has been delayed in time, at the output 453 from the carrier signal which is supplied to a second input 454.

In consequence, when there is a high level in the signal at the first input of the gate at the same time, the logic AND gate 46 switches to a logic high state and emits this at the output 43. A pulse-width-modulated signal is thus produced at the output 43, with the duty ratio being set by means of a regulation signal at the control input 42. The pulse-width-modulated signal contains the frequency components of a fundamental frequency and of the associated harmonic frequencies, as already explained above. The harmonic components are suppressed by the filter device 32, and are then passed to the amplifier 31 which is connected downstream from the filter. In consequence, the amplifier 31 amplifies a signal which has already been filtered.

Figure 3:
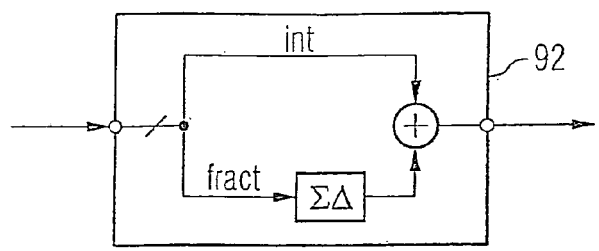
FIG. 3 shows one embodiment of a ΣΔ modulator for processing time amplitude information in accordance with an aspect of the invention.

FIG. 3 shows one embodiment of a modulator 92 which is connected upstream of the control input 42 of the pulse width modulator 4. The modulator 92 has a first and a second signal path, with an integer component "int" of the amplitude modulation signal being supplied to the first signal path, and with a fractional component "fract" being supplied to the second signal path, for processing. For this purpose, the second signal path contains a ΣΔ modulator (sigma-delta modulator). The integer component and a modulated fractional component are joined together on the output side.

Figure 4:
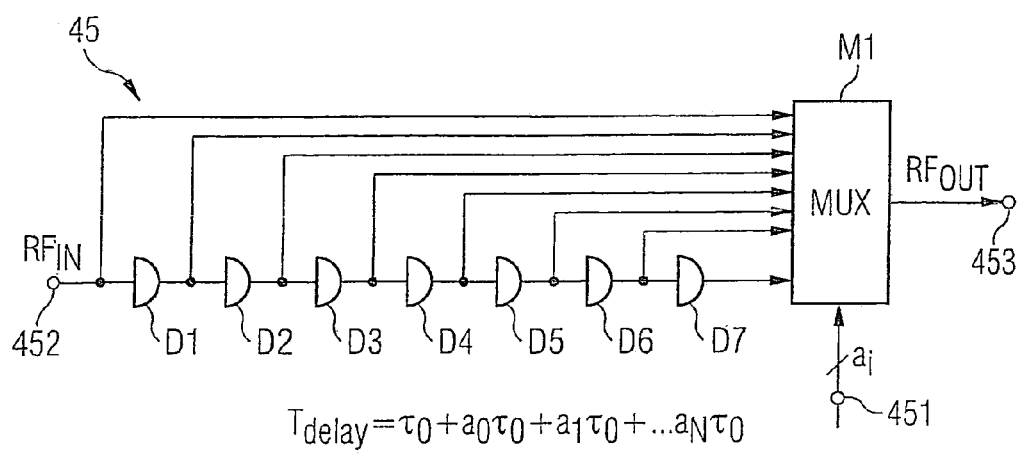
FIG. 4 shows one exemplary embodiment of a delay unit in accordance with an aspect of the invention.

FIG. 4 shows one refinement of the delay circuit 45. In this case as well, components which act in the same way and/or have the same function are provided with the same reference symbols. The signal input 452 of the delay circuit 45 is connected to a multiplexer M1 via a plurality of individual delay elements D1, D2 to D7. The individual delay elements D1 to D7 delay a pulsed signal at the input 452 by a fixed time offset $\tau_0$ in each case. The multiplexer thus emits a time-delayed pulse at the output 453, depending on a regulation signal at the control input 451. The time delay is predetermined by the regulation signal at the control input 451, and is once again synchronized to the phase-modulated signal.

The refinement of the polar modulator according to the invention uses a pure digital circuit rather than a power-consuming mixer circuit, and this purely digital circuit can be in the form of an integrated circuit in a semiconductor body. The amplitude modulation is in this case carried out by pulse width modulation with downstream filtering of the higher harmonic components. The pulse width modulation changes the duty ratio, and phase matching is required in order to prevent amplitude/phase distortion. The phase distortion is, in one example, carried out by means of a suitable phase matching circuit in the digital domain by changing the phase modulation word. This is done by varying the zero crossing of the carrier frequency as a function of the amplitude information. The predistortion circuit, which is also provided in the amplitude modulation path, compensates for the sinusoidal relationship between the output signal and the duty ratio.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

| List of reference symbols | |
|---|---|
| 2: | Phase locked loop |
| 4: | Pulse width modulator |
| 5: | Antenna |
| 6: | Voltage controlled oscillator |
| 7: | Frequency divider |
| 8: | Loop filter |
| 9: | Charge pump |
| 10: | Phase detector |
| 11: | Amplitude information input |
| 12: | Phase modulation input |
| 21: | Control input |
| 22: | Sigma-delta modulator |
| 23: | Reference input |

-continued

List of reference symbols

| | |
|---|---|
| 23a: | Reference generator |
| 24: | Node, output node |
| 28: | Feedback path |
| 30: | Limiting amplifier |
| 31: | Amplifier |
| 32: | Matching network, low-pass filter |
| 41: | Signal input |
| 42: | Control input |
| 43: | Signal output |
| 90: | Predistortion unit |
| 91: | Phase matching unit |
| 92: | Sigma/delta modulator |
| 87: | Scaling unit |
| 872: | Scaling signal input |
| 873: | Signal input |
| D1, . . . , D6, D7: | Delay elements |
| 44: | Flipflop |
| 45, 45a: | Delay unit |
| 46: | AND gate |
| η: | Duty ratio |
| H1, H2, H3: | Fundamental frequency, harmonics |

What is claimed is:

1. A polar modulator comprising:
a first signal input for supplying a phase modulation signal and a second signal input for supplying an amplitude modulation signal;
a phase locked loop having a reference input, a control input, and an output node, wherein the reference input supplies a reference signal, the control input receives a loop control signal, wherein the loop control signal is at least partially derived from the phase modulation signal and wherein the phase locked loop is operable to emit a radio-frequency signal at one frequency at the output node, the one frequency being derived from the reference signal and from the loop control signal;
a pulse width modulator having a signal input, a control input, and an output, wherein the signal input receives the radio-frequency signal, wherein the control input receives a regulation signal, and the pulse width modulator is operable to vary a duty ratio of the radio-frequency signal applied to the signal input according to the regulation signal to provide a phase-amplitude modulated signal at the output; and
a filter arranged downstream from the output of the pulse width modulator for suppression of harmonic components of the phase-amplitude modulated signal.

2. The polar modulator of claim 1, further comprising an amplifier circuit having a limiting gain response that receives the radio-frequency signal from the output node of the phase locked loop, amplifies the radio-frequency signal, and supplies the radio-frequency signal to the signal input of the pulse width modulator.

3. The polar modulator of claim 1, wherein the pulse width modulator comprises a flipflop comprising a clock input as the signal input and data output as the output of the pulse width modulator, wherein the flipflop further comprises a reset input that receives a pulsed signal derived from the regulation signal.

4. The polar modulator of claim 1, wherein the pulse width modulator comprises a logic gate having a first input, a second input, and a data output, wherein the first input is the signal input, the second input is receives a pulsed signal derived from the regulation signal, and the data output is the output of the pulse width modulator.

5. The polar modulator of claim 4, wherein the logic gate is an AND gate.

6. The polar modulator of claim 4, wherein the pulse width modulator further comprises a delay unit that receives the regulation signal and provides the pulsed signal to the second input of the logic gate.

7. The polar modulator of claim 6, wherein the delay unit comprises at least two series connected delay elements.

8. The polar modulator of claim 6, wherein the delay unit comprises an additional input coupled to the output of the pulse width modulator.

9. The polar modulator of claim 1, wherein the phase locked loop comprises a frequency divider in a feedback path that divides a frequency of the radio-frequency signal applied to its input side by a variable division factor and has an adjustment input connected to the first signal input for adjustment of the division factor.

10. The polar modulator of claim 9, further comprising a sigma-delta frequency divider connected upstream of the adjustment input of the frequency divider and having an input side coupled to the first signal input.

11. The polar modulator of claim 1, wherein the phase locked loop has a two-point modulator.

12. The polar modulator of claim 1, further comprising a multiplication unit connected to the second input that scales the amplitude modulation signal by a scaling factor.

13. The polar modulator of claim 12, further comprising a distortion unit connected to the multiplication unit.

14. The polar modulator of claim 13, wherein the distortion unit comprises a table for storing predistortion coefficients.

15. The polar modulator of claim 14, wherein the predistortion coefficients represent a reciprocal function of a trigonometric function.

16. The polar modulator of claim 15, further comprising a matching circuit connected to the first signal input that receives a reference signal from the distortion unit and modifies the phase modulation signal according to the reference signal from the distortion unit.

17. A method for modulation of a signal comprising:
providing a phase locked loop with a variable frequency division ratio in a feedback path;
providing phase information and amplitude information for signal modulation;
supplying a reference signal to the phase locked loop;
adjusting the frequency division ratio at least partially as a function of the phase information;
producing a phase-modulated signal at least partially as a function of a selected frequency division ratio; and
varying a pulse width of the phase-modulated pulsed signal as a function of a regulation signal to generate a phase-amplitude modulated signal.

18. The method of claim 17, wherein providing the phase information comprises varying the phase information as a function of the amplitude information.

19. The method of claim 17, further comprising deriving the regulation signal from the amplitude information.

20. The method of claim 17, further comprising filtering the phase-modulated signal to suppress higher order harmonic signal components.

* * * * *